United States Patent
Yoshizawa

(10) Patent No.: US 7,106,064 B2
(45) Date of Patent: Sep. 12, 2006

(54) METHOD AND APPARATUS FOR QUADRATURE DETECTION AND MRI SYSTEM

(75) Inventor: Nobuhiro Yoshizawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 28 days.

(21) Appl. No.: 10/975,601

(22) Filed: Oct. 28, 2004

(65) Prior Publication Data

US 2005/0093545 A1   May 5, 2005

(30) Foreign Application Priority Data

Oct. 30, 2003   (JP) .............................. 2003-370503

(51) Int. Cl.
*G01V 3/00* (2006.01)
(52) U.S. Cl. .................................... 324/322; 324/76.78
(58) Field of Classification Search ................. 324/322, 324/76.78
See application file for complete search history.

(56) References Cited

U.S. PATENT DOCUMENTS

| 4,682,112 | A | * | 7/1987 | Beer .......................... 324/322 |
| 4,707,664 | A |   | 11/1987 | Fehn et al. |
| 4,740,752 | A | * | 4/1988 | Arakawa et al. ............ 324/318 |
| 4,746,860 | A |   | 5/1988 | Satoh |
| 5,436,600 | A |   | 7/1995 | Van Heteren et al. |
| 6,198,962 | B1 |  | 3/2001 | Su |

OTHER PUBLICATIONS

Luyten MJ et al., "Programmable Direct Receiver for Low Field Magnetic Resonance Imaging", Proceedings of the ISMRM 3rd Meeting, Nice, 1995; p. 394.*
Proska R, "A Fully Digital Spectrometer for Low Field MR Imaging Systems", Proceedings of the 7th Annual Meeting of the Society for Magnetic Resonance in Medicine, Berkeley, 1988; p. 266.*
de Nascimento GC et al., "A Simple, Ultralow Magnetic Field NMR Imaging System", J Phys E: Sci Instrum 22 (1989) p. 774-779.*
Powers JE et al, "Ultrasound Phased Array Delay Lines Based on Quadrature Sampling Techniques", IEEE Trans on Sonics and Ultrasonics, vol. SU-27, No. 6, 1980; p. 287-294.*
Ho KC et al, "A Digital Quadrature Demodulation System", IEEE Trans on Aerospace and Electronic Systems, vol. 32, No. 4, Oct. 1996, p. 1218-1227.*
Guirong G et al, "Mixer-free All Digital Quadrature Demodulation", ICSP's Fourth International Conference on Signal Processing Proceedings, Beijing 1998, vol. 2, p. 1704-1707.*

* cited by examiner

*Primary Examiner*—Diego Gutierrez
*Assistant Examiner*—Jeremiah Shipman
(74) *Attorney, Agent, or Firm*—Carl B. Horton, Esq.; Armstrong Teasdale LLP

(57) ABSTRACT

A method of eliminating unnecessary frequency components using a quadrature detector. The method includes converting an analog input signal into a digital signal f1(t), and the signal f1 (t) is delayed by a sampling time τ to form a signal f2 (t). Then, letting the reference frequency be ω0, the I- and Q-components in quadrature detection by the following expression:

$I = \{f2(t)*\sin \omega 0 t - f1(t)*\sin \omega 0(t-\tau)\}/\sin \omega 0 \tau$ $Q = \{f2(t)*\cos \omega 0 t - f1(t)*\cos \omega 0(t-\tau)\}/\sin \omega 0 \tau.$

16 Claims, 1 Drawing Sheet

METHOD AND APPARATUS FOR QUADRATURE DETECTION AND MRI SYSTEM

CROSS REFERENCE TO RELATED APPLICATIONS

This application claims the benefit of Japanese Application No. 2003-370503 filed Oct. 30, 2003.

BACKGROUND OF THE INVENTION

The present invention relates to a method and an apparatus for quadrature detection and an MRI (Magnetic Resonance Imaging) system. More particularly, the present invention relates to a method and an apparatus for quadrature detection wherein high-frequency input signals are converted into low-frequency signals and an MRI system equipped with such a quadrature detector.

An MRI system subjects a magnetic resonance signal, received as RF (Radio Frequency) signal, to quadrature detection by reference signals to obtain a baseband signal. Then, based on the baseband signal, the MRI system reconstructs an image. In quadrature detection, in addition to the baseband signal, a signal having a center frequency two times that of the reference signals. Since this signal is unnecessary, however, it is removed through a filter. (Refer to Non-Patent Document 1, for example.)

[Non-patent Document 1] *NMR Medicine, Basic and Clinical*, ed. Society for the Study of Nuclear Magnetic Resonance Medicine (3rd ed.), Maruzen, Nov. 20, 1987, pp. 106–108

The frequency of the reference signal is brought into correspondence with the center frequency of the RF signal. Therefore, if the center frequency of the RF signal varies, the frequency of the reference signal must be accordingly varied. As a result, the filter for unnecessary component removal must be changed.

SUMMARY OF THE INVENTION

Therefore, an object of the present invention is to implement a method and an apparatus for quadrature detection wherein unnecessary frequency components are not produced and an MRI system equipped with such a quadrature detector.

(1) According to an aspect for solving the problem the invention is a method for quadrature detection. The method for quadrature detection is characterized in that: an analog input signal is converted into a digital signal f1 (t), and the signal f1 (t) is delayed by a sampling time $\tau$ to form a signal f2(t). Then, letting the reference frequency be $\omega 0$, the I- and Q-components in quadrature detection are determined by Expression 2:

[Ex. 2]

$$I = \{f2(t) \ast \sin \omega 0 t - f1(t) \ast \sin \omega 0 (t-\tau)\}/\sin \omega 0 \tau$$

$$Q = \{f2(t) \ast \cos \omega 0 t - f1(t) \ast \cos \omega 0 (t-\tau)\}/\sin \omega 0 \tau$$

(2) According to another aspect for solving the problem, the invention is a quadrature detector characterized in that the quadrature detector comprises: an analog-to-digital converting means which converts an analog input signal into a digital signal f1 (t); a first delaying means which delays the signal f1 (t) by a sampling time $\tau$ to form a signal f2(t); a second delaying means which delays a reference signal sin $\omega 0 t$ by a sampling time $\tau$ to form a delay reference signal sin $\omega 0(t-\tau)$; a third delaying means which delays a reference signal cos $\omega 0 t$ by a sampling time $\tau$ to form a delay reference signal cos $\omega 0(t-\tau)$; a first multiplying means which multiplies the signal f2(t) by the reference signal sin $\omega 0 t$; a second multiplying means which multiples the signal f1(t) by the delay reference signal sin $\omega 0(t-\tau)$; a third multiplying means which multiples the signal f2(t) by the reference signal cos $\omega 0 t$; a fourth multiplying means which multiplies the signal f1 (t) by the delay reference signal cos $\omega 0(t-\tau)$; a first subtracting means which determines the difference between the output signal of the first multiplying means and the output signal of the second multiplying means; a second subtracting means whick determines the difference between the output signal of the third multiplying means and the output signal of the fourth multiplying means; a fifth multiplying means which multiplies the output signal of the first subtracting means by a predetermined coefficient; and a sixth multiplying means which multiplies the output signal of the second subtracting means by a predetermined coefficient.

(3) According to a further aspect for solving the problem, the invention is an MRI system. The MRI system applies a static magnetic field, gradient fields, and a high-frequency magnetic field to an object by a magnet system, subjects resulting magnetic resonance signals to quadrature detection by a quadrature detector, and reconstructs an image base on the signals which underwent quadrature detection. The MRI system is characterized in that it is equipped with the quadrature detector comprising: an analog-to digital converting means which converts an analog input signal into a digital signal f1 (t); a first delaying means which delays the signal f1 (t) by a sampling time $\tau$ to form a signal f2(t); a second delaying means which delays a reference signal sin $\omega 0 t$ by a sampling time $\tau$ to form a delay reference signal sin $\omega 0(t-\tau)$; a third delaying means which delays a reference signal cos $\omega 0 t$ by a sampling time $\tau$ to form a delay reference signal cos $\omega 0(t-\tau)$; a first multiplying means which multi-plies the signal f2(t) by the reference signal sin $\omega 0 t$; a second multiplying means which multiples the signal f1 (t) by the delay reference signal sin $\omega 0(t-\tau)$; a third multiplying means which multiples the signal f2(t) by the reference signal cos $\omega 0 t$; a fourth multiplying means which multiplies the signal f1 (t) by the delay reference signal cos $\omega 0(t-\tau)$; a first subtracting means which determines the difference between the output signal of the first multiplying means and the output signal of the second multiplying means; a second subtracting means which determines the difference between the output signal of the third multiplying means and the output signal of the fourth multiplying means; a fifth multiplying means which multiplies the output signal of the first subtracting means by a predetermined coefficient; and a sixth multiplying means which multiplies the output signal of the second subtracting means by a predetermined coefficient.

The coefficient is preferably 1/sin $\omega 0 t$ for the purpose of making appropriate the amplitude of an output signal according to the frequency of a reference signal. The first to third delaying means, the first to sixth multiplying means, and the first and second subtracting means are preferably constituted of DSP as a whole in terms of versatility.

The first to third delaying means, the first to sixth multiplying means, and the first and second subtracting means are preferably constituted of FPGA as a whole in terms of flexibility. The first to third delaying means, the first to sixth multiplying means, and the first and second subtracting means are preferably constituted of ASIC as a whole because of the absence of redundancy.

The first to third delaying means, the first to sixth multiplying means, and the first and second subtracting means preferably operates on a clock whose frequency is 1/τin terms of synchronous operation. The first to sixth multiplying means and the first and second subtracting means preferably perform pipeline operation because asynchronous operation is feasible.

According to the invention according to the aspect described in (1) above, the following is carried out: an analog input signal is converted into a digital signal f1(t), and the signal f1(t) is delayed by the sampling time τ to form a signal f2(t). Then, letting the reference frequency be ω0, the I- and Q-components in quadrature detection are determined by Expression 3:

[Ex. 3]

$$I=\{f2(t)*\sin \omega 0 t - f1(t)*\sin \omega 0(t-\tau)\}/\sin \omega 0 \tau$$

$$Q=\{f2(t)*\cos \omega 0 t - f1(t)*\cos \omega 0(t-\tau)\}/\sin \omega 0 \tau$$

Therefore, unnecessary frequency components are not produced.

The invention according to the another or further aspect described in (2) or (3) above comprises the first to third delaying means, first to sixth multiplying means, and first and second subtracting means. Then, signal processing is carried out based on the above expression, Therefore, unnecessary frequency components are not contained in output signals.

Further objects and advantages of the present invention will be apparent from the following description of the preferred embodiments of the invention as illustrated in the accompanying drawings.

DETAILED DESCRIPTION OF THE INVENTION

Figure 1:
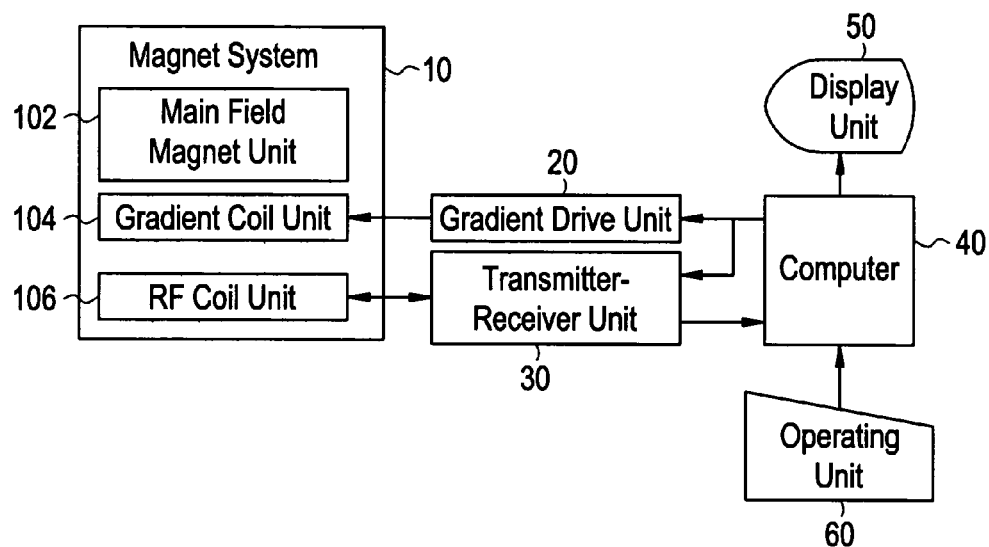
FIG. 1 is a block diagram of the MRI system.

Referring to drawings, the best mode for carrying out the invention will be described in detail below. The present invention is not limited to the best mode for carrying out the invention. FIG. 1 is a block diagram of an MRI system. This apparatus is an example of the best mode for carrying out the invention. The constitution of the apparatus illustrates an example of the best mode for carrying out the invention with respect to MRI system.

As illustrated in the figure, the apparatus includes a magnet system 10. The magnet system 10 include a main field magnet unit 102, a gradient coil unit 104, and an RF coil unit 106. The magnet system 10 has an imaging space in it, and an object whose image is to be picked up is carried into and out of the imaging space.

The main field magnet unit 102 forms a static magnetic field in the imaging space. The main field magnet unit 102 is constituted using, for example, superconducting electromagnets. The constitution of the main field magnet unit 102 is not limited to this, and may be constituted using normal conduction electromagnets, permanent magnets, or the like.

The gradient coil unit 104 generates three gradient fields. This is for providing the static magnetic field strength with a gradient, respectively, in the directions of three axes orthogonal to one another: slice axis, phase axis, and frequency axis. To enable the generation of such gradient fields, the gradient coil unit 104 has three systems of gradient coils.

The RF coil unit 106 forms an RF magnetic field for exciting spins in the body of an object in the static magnetic fields space. Formation of RF magnetic field is also designated as transmission of RF pulse. An electromagnetic wave which produced by excited spins, that is, a magnetic resonance signal is detected by the RF coil unit 106. The magnetic resonance signal is an RF signal.

The magnetic resonance signal becomes a signal in the frequency domain, that is, Fourier space. The magnetic resonance signal is encoded on two axes by gradient in the direction of phase axis and in the direction of frequency axis. Therefore, the magnetic resonance signal is obtained as a signal in the two-dimensional Fourier space. The two-dimensional Fourier space is also designated as k-space.

The gradient coil unit 104 is connected with a gradient drive unit 20. The gradient drive unit 20 supplies a driving signal to the gradient coil unit 104 to generate gradient fields. The gradient drive unit 20 has three systems of drive circuits in correspondence with the three systems of gradient coils in the gradient coil unit 104.

The RF coil unit 106 is connected with a transmitter-receiver unit 30. The transmitter-receiver unit 30 supplies a driving signal to the RF coil unit 106 to transmit an RF pulse. Also, the transmitter-receiver unit 30 receives a detection signal from the RF coil unit 106. The reception signal is converted into digital signal in the transmitter-receiver unit 30, as described later. Further, the reception signal is subjected to quadrature detection through a quadrature detection circuit, and is inputted as a digital baseband signal to a computer 40.

The computer 40 stores data, inputted from the transmitter-receiver unit 30, in memory. A data space is formed in the memory. This data space corresponds to the k-space. The computer 40 subjects the data in the k-space to two-dimensional inverse Fourier transform, and thereby reconstructs an image. Further, the computer 40 controls the gradient drive unit 20 and the transmitter-receiver unit 30 to carry out imaging.

The computer 40 is connected with a display unit 50 and an operating unit 60. The display unit 50 comprises a graphic display or the like. The operating unit 60 comprises a keyboard or the like equipped with a pointing device.

The display unit 50 displays reconstructed images and varied information outputted from the computer 40. The operating unit 60 is operated by the user, and inputs varied instructions, information, and the like to the computer 40. The user operates the MRI system in an interactive manner through the display unit 50 and the operating unit 60.

Figure 2:
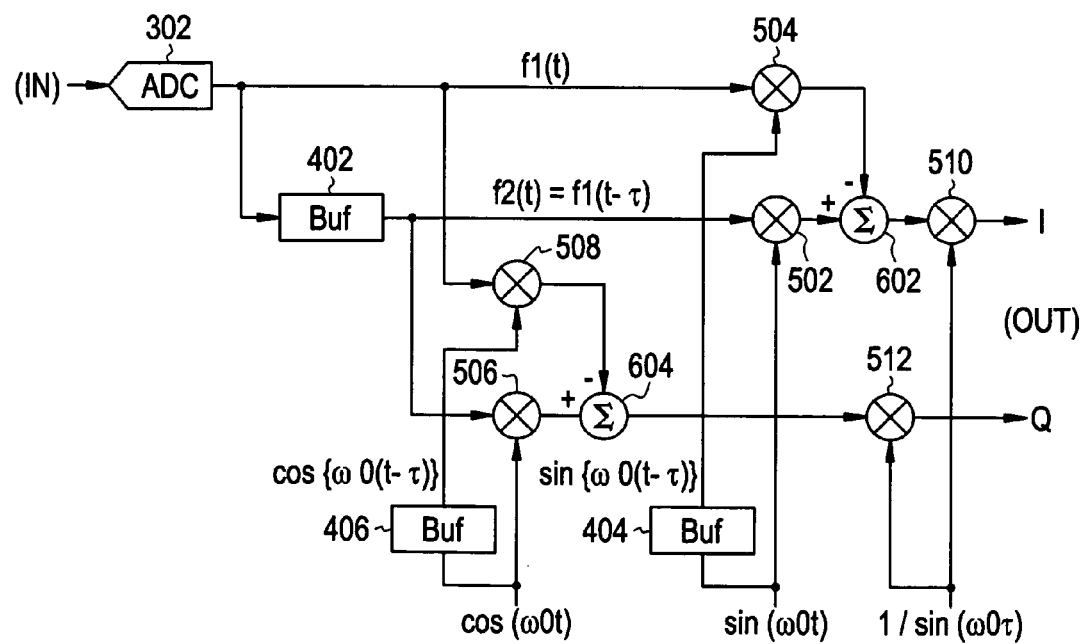
FIG. 2 is a block diagram of the quadrature detection circuit.

FIG. 2 is a block diagram illustrating an example of the quadrature detection circuit. The quadrature detection circuit forms part of the transmitter-receiver unit 30. This circuit is an example of the best mode for carrying out the invention. The constitution of the circuit illustrates an example of the best mode for carrying out the invention with respect to quadrature detector. The operation of the circuit illustrates an example of the best mode for carrying out the invention with respect to method for quadrature detection.

As illustrated in the figure, the circuit comprises an analog-to-digital converter 302, data buffers 402, 404, and 406, multipliers 502, 504, 506, 508, 510, and 512, and subtracters 602 and 604.

The analog-to-digital converter 302 converts an analog input signal into a digital signal f1(t). The input signal is an RF signal received from the RF coil unit 106. The sampling period of the analog-to-digital converter 302 is τ. The analog-to-digital converter 302 is an example of the analog-to-digital converting means in the present invention.

The signal f1 (t) is inputted to the buffer 402, which then outputs a signal f2(t). The signal f2(t) is obtained by delaying the signal f1 (t) by τ. The buffer 402 functions as a delay device whose delay time is τ. The buffer 402 is an example of the first delaying means in the present invention.

The signal f2(t) is multiplied by a reference signal sin ω0t at the multiplier 502. The signal f1(t) is multiplied by a delay reference signal sin ω0(t−τ) at the multiplier 504. The delay reference signal sin ω0(t−τ) is obtained by delaying the reference signal sin ω0t by τ at the buffer 404.

The multiplier 502 is an example of the first multiplying means in the present invention. The multiplier 504 is an example of the second multiplying means in the present invention. The buffer 404 is an example of the second delaying means in the present invention.

The subtracter 602 determines the difference between the output signals of the multipliers 502 and 504. This differential signal is multiplied by a coefficient 1/sin ω0τ at the multiplier 510. Setting the coefficient to 1/sin ω0τ is preferable for the purpose of making appropriate the amplitude of an output signal according to the frequency of a reference signal. The coefficient by which multiplication is carried out may be an appropriate constant value. A signal indicating the result of multiplication is outputted as an I-component of quadrature detection signal. The subtracter 602 is an example of the first subtracting means in the present invention. The multiplier 510 is an example of the fifth multiplying means in the present invention.

The signal f2(t) is multiplied by a reference signal cos ω0t at the multiplier 506, and the signal f1 (t) is multiplied by a delay reference signal cos ω0(t−τ) at the multiplier 508. The delay reference signal cos ω0(t−τ) is obtained by delaying the reference signal cos ω0t by τ at the buffer 406.

The multiplier 506 is an example of the third multiplying means in the present invention. The multiplier 508 is an example of the fourth multiplying means in the present invention. The buffer 406 is an example of the third delaying means in the present invention.

The subtracter 604 determines the difference between the output signals of the multipliers 506 and 508. This differential signal is multiplied by the coefficient 1/sin ω0t at the multiplier 512. Setting the coefficient to 1/sin ω0t is preferable for the purpose of making appropriate the amplitude of an output signal according to the frequency of a reference signal. The coefficient by which multiplication is carried out may be an appropriate constant value. A signal indicating the result of multiplication is outputted as Q-component of quadrature detection signal. The subtracter 604 is an example of the second subtracting means in the present invention. The multiplier 512 is an example of the sixth multiplying means in the present invention.

The I- and Q-components obtained by the above-mentioned data processing become signal which are represented by Expression 4:

[Ex. 4]

$$I=\{f2(t)*\sin \omega 0t - f1(t)*\sin \omega 0(t-\tau)\}/\sin \omega 0\tau$$

$$Q=\{f2(t)*\cos \omega 0t - f1(t)*\cos \omega 0(t-\tau)\}/\sin \omega 0\tau$$

When the frequency ω0 of the reference signal is matched with the center frequency of the RF signal, both of these I- and Q-components become baseband signals for the reason described below. At the same time, the baseband signals do not contain a signal whose frequency is 2ω0. Therefore, a filter for removing signals whose frequency is 2ω0 is unnecessary. For this reason, even if the frequency of a reference signal is varied in accordance with variation in the center frequency of an RF signal, that can be coped with without any modification.

This quadrature detection circuit can be used to convert the band into any frequency band as well as baseband. Even in such a case, only the frequency component of the difference between the center frequency of the input signal and the frequency of the reference signal is obtained. The frequency component of the sum of them is not generated. Therefore, a filter for removing unnecessary components is not required.

The circuit is constituted of, for example, DSP (Digital Signal Processor) as a whole excepting the analog-to-digital converter 302. Thus, a quadrature detection circuit excellent in versatility is obtained. Alternatively, the circuit may be constituted of FPGA (Field Programmable Gate Array) or ASIC (Application Specific Integrated Circuit). Thus, a quadrature detection circuit excellent in flexibility or free from redundancy, respectively, is obtained. The circuit may be constituted of appropriate discrete components, needless to add.

This circuit operates on a clock whose frequency is 1/τ. Thus, the operations of the individual parts of the circuit can be synchronized with one another. Alternatively, the circuit may be so constituted that it performs pipeline operation. Thus, asynchronous operation is feasible.

The reason why the I- and Q-components become only baseband signals will be described. The signal f1 (t) is represented by Expression 5:

[Ex. 5]

$$f1(t)=\int F(\omega)*\cos\{\omega t+\theta(\omega)\}d\omega$$

The signal f2 (t) is represented by Expression 6:

[Ex. 6]

$$f2(t) = f1(t - \tau)$$

$$= \int F(\omega) * \cos\{\omega(t-\tau) + \theta(\omega)\}d\varpi$$

$$= \int F(\omega) * \cos\{\omega t + \theta(\omega)\} * \cos\{\omega t + \theta(\omega)\} *$$

$$\sin\{\omega\tau\}]d\omega$$

If the frequency bandwidth 2ω1 of the signal f1 (t) is sufficiently narrower than the frequency bandwidth determined by the sampling period τ, the approximation expressed by Expression 7 holds within the band of from ω−ω1 to ωto ω+ω1:

[Ex. 7]

$$\cos\{\omega\tau\}\approx\cos\{\omega 0\tau\}$$

Therefore, the right side can be rewritten as follow:

[Ex. 8]

$$\text{Right side} \approx \int F(\omega) * \cos\{\omega t + \theta(\omega)\} * \cos\{\omega 0\tau\} +$$

$$\sin\{\omega t + \theta(\omega)\} * \sin\{\omega 0\tau\}]d\omega$$

$$= \cos\{\omega 0\tau\} * \int F(\omega) * [\cos\{\omega t + \theta(\omega)\}]d\omega +$$

$$\sin\{\omega 0\tau\} * \int F(\omega) * [\sin\{\omega t + \theta(\omega)\}]d\omega$$

The expression is rewritten as mentioned above.

Consequently, consideration will be given to a signal g1(t) expressed by Expression 9, where j is an imaginary unit.

$$g1(t) = f1(t) + j*[f2(t) - f1(t)*\cos\{\omega 0\tau\}]/\sin\{\omega 0\tau\} \quad [\text{Ex. 9}]$$

$$= \int F(\omega)*\cos\{\omega t + \theta(\omega)\}d\omega + j*[\cos\{\omega 0\tau\}*$$

$$\int F(\omega)*[\cos\{\omega t + \theta(\omega)\}]d\omega + \sin\{\omega 0\tau\}*$$

$$\int F(\omega)*[\sin\{\omega t + \theta(\omega)\}]d\omega -$$

$$\int F(\omega)*\cos\{\omega t + \theta(\omega)\}d\omega*\cos[\{\omega 0\tau\}]/\sin\{\omega 0\tau\}$$

$$= \int F(\omega)*\cos\{\omega t + \theta(\omega)\}d\omega + j*$$

$$\int F(\omega)*\sin\{\omega t + \theta(\omega)\}d\omega$$

$$= \int F(\omega)*\cos\{\omega t + \theta(\omega)\} + j*\sin\{\omega t + \theta(\omega)\}]d\omega$$

As described above, the signal g1 (t) becomes the complex representation of a signal whose frequency is ω. Such a signal becomes a signal only in baseband by subjecting the signal to quadrature detection using a signal represented by Expression 10 as reference signal.

[Ex. 10]

$$\cos\{-\omega 0 t\} + j*\sin\{-\omega 0 t\}$$

This fact is publicly known.

Such a reference signal is multiplied by the signal g1 (t) as follows:

$$g2(t) = g1(t)*\{\cos(-\omega 0 t) + j*\sin(-\omega 0 t)\} \quad [\text{Ex. 11}]$$

$$= [f1(t) + j*\{f2(t) - f1(t)*\cos(\omega 0\tau)\}/\sin(\omega 0\tau)]*$$

$$\{\cos(\omega 0 t) - j*\sin(\omega 0 t)\}$$

$$= f1(t)*\cos(\omega 0 t) + \{f2(t) - f1(t)*\cos(\omega 0 t)\}/$$

$$\sin(\omega 0\tau)*\sin(\omega 0 t)\} + j*[-f1(t)*\sin(\omega 0 t) +$$

$$\{f2(t) - f1(t)*\cos(\omega 0\tau)\}/\sin(\omega 0\tau)*\cos(\omega 0 t)]$$

$$= [\{f1(t)*\cos(\omega 0 t)*\sin(\omega 0\tau) + \{f2(t) - f1(t)*$$

$$\cos(\omega 0\tau)\}*\sin(\omega 0 t)\} - j*\{f1(t)*\sin(\omega 0 t)*$$

$$\sin(\omega 0\tau) - \{f2(t) - f1(t)*\cos(\omega 0\tau)\}*\cos(\omega 0 t)\}]/$$

$$\sin(\omega 0\tau)$$

$$= [\{f2(t)*\sin(\omega 0 t) + f1(t)*\{\cos(\omega 0 t)*\sin(\omega 0 t) -$$

$$\cos(\omega 0 t)*\sin(\omega 0 t)\}\} + j*\{f2(t)*\cos(\omega 0 t) -$$

$$f1(t)*\{\sin(\omega 0 t)*\sin(\omega 0\tau) + \cos(\omega 0\tau)*$$

$$\cos(\omega 0 t)\}\}]/\sin(\omega 0\tau)$$

$$= [\{f2(t)*\sin(\omega 0 t) - f1(t)*\sin\{\omega 0(t-\tau)\} +$$

$$j*\{f2(t)*\cos(\omega 0 t) - f1(t)*\cos\{\omega 0(t-\tau)\}\}]/$$

$$\sin(\omega 0\tau)$$

As described above, the real number portion is expressed by Expression 12:

[Ex. 12]

$$I = \{f2(t)*\sin \omega 0 t - f1(t)*\sin \omega 0(t-\tau)\}/\sin \omega 0\tau$$

The imaginary number portion is expressed by Expression 13:

[Ex. 13]

$$Q = \{f2(t)*\cos \omega 0 t - f1(t)*\cos \omega 0(t-\tau)\}/\sin \omega 0\tau$$

These I and Q are none other than the output signal of the quadrature detection circuit illustrated in FIG. 2.

Many widely different embodiments of the invention may be configured without departing from the spirit and the scope of the present invention. It should be understood that the present invention is not limited to the specific embodiments described in the specification, except as defined in the appended claims.

The invention claimed is:

1. A method for quadrature detection comprising:
   setting a reference frequency to be $\omega_0$;
   using an analog-to-digital converting device to convert an analog input signal into a digital signal f1(t);
   using a first delaying device to delay the signal f1(t) by a sampling time τ to form a signal f2(t);
   using a second delaying device to delay a reference signal sin $\omega_0$t by the sampling time τ to form a delay reference signal sin $\omega_0$(t-τ);
   using a third delaying device to delay a reference signal cos $\omega_0$t by the sampling time τ to form a delay reference signal cos $w_0$(t-τ);
   using a first multiplying device to multiply the signal f2(t) by the reference signal sin $\omega_0$t;
   using a second multiplying device to multiply the signal f1(t) by the delayed reference signal sin $\omega_0$(t-τ);
   using a third multiplying device to multiply the signal f2(t) by the reference signal cos $\omega_0$t;
   using a fourth multiplying device to multiply the signal f1(t) by the delayed reference signal cos $\omega_0$(t-τ);
   using a first subtracting device to determine a difference between the output signal of said first multiplying device and the output signal of said second multiplying device;
   using a second subtracting device to determine a difference between the output signal of said third multiplying device and the output signal of said fourth multiplying device;
   using a fifth multiplying device to multiply the output signal of said first subtracting device by a predetermined coefficient; and
   using a sixth multiplying device to multiply the output signal of said second subtracting device by a predetermined coefficient;
   and wherein the I- and Q-components in quadrature detection are determined by:

$$I = \{f2(t)*\sin \omega_0 t - f1(t)*\sin \omega_0(t-\tau)\}/\sin \omega_0\tau$$

$$Q = \{f2(t)*\cos \omega_0 t - f1(t)*\cos \omega_0(t-\tau)\}/\sin \omega_0\tau.$$

2. A quadrature detector comprising:
   an analog-to-digital converting device which converts an analog input signal into a digital signal f1(t);
   a first delaying device which delays the signal f1(t) by a sampling time τ to form a signal f2(t);
   a second delaying device which delays a reference signal sin ω0t by the sampling time τ to form a delay reference signal sin ω0(t-τ);
   a third delaying device which delays a reference signal cos ω0t by the sampling time τ to form a delay reference signal cos ω0(t-τ);
   a first multiplying device which multiplies the signal f2(t) by the reference signal sin ω0t;

a second multiplying device which multiplies the signal f1(t) by the delay reference signal sin ω0(t−τ);

a third multiplying device which multiplies the signal f2(t) by the reference signal cos ω0t;

a fourth multiplying device which multiplies the signal f1(t) by the delay reference signal cos ω0(t−τ);

a first subtracting device which determines a difference between the output signal of said first multiplying device and the output signal of said second multiplying device;

a second subtracting device which determines a difference between the output signal of said third multiplying device and the output signal of said fourth multiplying device;

a fifth multiplying device which multiplies the output signal of said first subtracting device by a predetermined coefficient; and a sixth multiplying device which multiplies the output signal of said second subtracting device by a predetermined coefficient.

3. The quadrature detector according to claim 2, wherein said coefficient is 1/sin ω0τ.

4. The quadrature detector according to claim 2, wherein first and third delaying device, said first to sixth multiplying device, and said first and second subtracting device are constituted of DSP as a whole.

5. The quadrature detector according to claim 2, wherein said first to third delaying device, said first to sixth multiplying device, and said first and second subtracting device are constituted of FPGA as a whole.

6. The quadrature detector according to claim 2, wherein said first to third delaying device, said first to sixth multiplying device, and said first and second subtracting device are constituted of ASIC as a whole.

7. The quadrature detector according to claim 2, wherein said first to third delaying device, said first to sixth multiplying device, and said first and second subtracting device operate on a clock whose frequency is 1/τ.

8. The quadrature detector according to claim 2, wherein said first to sixth multiplying device and said first and second subtracting device perform pipeline operation.

9. The quadrature detector according to claim 2, wherein said input signal is an RF signal.

10. An MRI system which applies a static magnetic field, gradient fields, and a high-frequency magnetic field to an object by a magnet system, subjects resulting magnetic resonance signals to quadrature detection by a quadrature detector, and reconstructs an image based on the signals which underwent quadrature detection, wherein said quadrature detector comprises:

an analog-to-digital converting device which converts an analog input signal into a digital signal f1(t);

a first delaying device which delays the signal f1(t) by a sampling time τ to form a signal f2(t);

a second delaying device which delays a reference signal sin ω0t by the sampling time τ to form a delay reference signal sin ω0(t−τ);

a third delaying device which delays a reference signal cos ω0t by the sampling time τ to form a delay reference signal cos ω0(t−τ);

a first multiplying device which multiplies the signal f2(t) by the reference signal sin ω0t;

a second multiplying device which multiplies the signal f1(t) by the delay reference signal sin ω0(t−τ);

a third multiplying device which multiplies the signal f2(t) by the reference signal cos ω0t;

a fourth multiplying device which multiplies the signal f1(t) by the delay reference signal cos ω0(t−τ);

a first subtracting device which determines a difference between the output signal of said first multiplying device and the output signal of said second multiplying device;

a second subtracting device which determines a difference between the output signal of said third multiplying device and the output signal of said fourth multiplying device;

a fifth multiplying device which multiplies the output signal of said first subtracting device by a predetermined coefficient; and a sixth multiplying device which multiplies the output signal of said second subtracting device by a predetermined coefficient.

11. The MRI system according to claim 10, wherein said coefficient is 1/sin ω0τ.

12. The MRI system according to claim 10, wherein said first to third delaying device, said first to sixth multiplying device, and said first and second subtracting device are constituted of DSP as a whole.

13. The MRI system according to claim 10, wherein said first to third delaying device, said first to sixth multiplying device, and said first and second subtracting device are constituted of FPGA as a whole.

14. The MRI system according to claim 10, wherein said first to third delaying device, said first to sixth multiplying device, and said first and second subtracting device are constituted of ASIC as a whole.

15. The MRI system according to claim 10, wherein said first to third delaying device, said first to sixth multiplying device, and said first and second subtracting device operate on a clock whose frequency is 1/τ.

16. The MRI system according to claim 10, wherein said first to sixth multiplying device and said first and second subtracting device perform pipeline operation.

* * * * *

UNITED STATES PATENT AND TRADEMARK OFFICE
CERTIFICATE OF CORRECTION

PATENT NO.      : 7,106,064 B2                                              Page 1 of 1
APPLICATION NO. : 10/975601
DATED           : September 12, 2006
INVENTOR(S)     : Yoshizawa It is certified that error appears in the above-identified patent and that said Letters Patent is hereby corrected as shown below:

In Claim 4, column 9, beginning on line 23, delete "wherein first and third" and insert --wherein said first to third--.

Signed and Sealed this

Twenty-ninth Day of April, 2008

JON W. DUDAS
*Director of the United States Patent and Trademark Office*